(12) United States Patent  
Feyh et al.

(10) Patent No.: US 9,159,637 B2  
(45) Date of Patent: Oct. 13, 2015

(54) ELECTRONIC DEVICE WITH AN INTERLOCKING MOLD PACKAGE

(71) Applicant: Robert Bosch GmbH, Stuttgart (DE)

(72) Inventors: Ando Lars Feyh, Palo Alto, CA (US); Gary O'Brien, Palo Alto, CA (US); Andrew Graham, Redwood City, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/203,012

(22) Filed: Mar. 10, 2014

(65) Prior Publication Data

US 2014/0264955 A1 Sep. 18, 2014

Related U.S. Application Data

(60) Provisional application No. 61/786,838, filed on Mar. 15, 2013.

(51) Int. Cl.  
*H01L 23/31* (2006.01)  
*H01L 21/56* (2006.01)  
*B81B 7/00* (2006.01)

(52) U.S. Cl.  
CPC .......... *H01L 23/3142* (2013.01); *B81B 7/0077* (2013.01); *H01L 21/56* (2013.01); *H01L 21/565* (2013.01); *B81C 2203/0154* (2013.01); *B81C 2203/0163* (2013.01); *H01L 23/3121* (2013.01); *H01L 2224/48091* (2013.01); *H01L 2924/1461* (2013.01)

(58) Field of Classification Search  
CPC ............ H01L 23/3107; H01L 23/49548; H01L 2924/0665; H01L 21/565; H01L 21/563; H01L 21/768  
USPC ......................................................... 257/787  
See application file for complete search history.

(56) References Cited

U.S. PATENT DOCUMENTS

| 6,519,844 | B1 | 2/2003 | Nagarajan et al. |
| 2006/0086188 | A1* | 4/2006 | Avramescu et al. ............ 73/700 |
| 2006/0270106 | A1 | 11/2006 | Chiu et al. |
| 2008/0073757 | A1* | 3/2008 | Kummerl et al. ............ 257/666 |
| 2008/0296751 | A1 | 12/2008 | Fan |
| 2009/0294932 | A1 | 12/2009 | Sahasrabudhe et al. |

FOREIGN PATENT DOCUMENTS

EP 1717562 A1 11/2006

OTHER PUBLICATIONS

International Search Report and Written Opinion corresponding to PCT Application No. PCT/US2014/022740, mailed Jul. 28, 2014 (11 pages).

* cited by examiner

*Primary Examiner* — Roy Potter  
(74) *Attorney, Agent, or Firm* — Maginot Moore & Beck LLP

(57) ABSTRACT

An electronic device includes a mold package which encapsulates a portion of the electronic device and does not encapsulate another portion of the electronic device to enable a sensing portion of the electronic device to be exposed to a condition to be sensed. In an electronic sensing device having a sensor formed by a substrate such as silicon, a sensor area is not encapsulated, but areas surrounding the sensor area are encapsulated. The area surrounding the sensor area includes one or more trenches or interlock structures formed in the surrounding substrate which receives the mold material to provide an interlock feature. The interlock feature reduces or substantially prevents the mold from delaminating at an interface of the mold and the substrate.

20 Claims, 3 Drawing Sheets

ELECTRONIC DEVICE WITH AN INTERLOCKING MOLD PACKAGE

This application claims the benefit of U.S. Provisional Application No. 61/786,838, filed Mar. 15, 2013, the disclosure of which is incorporated herein by reference in its entirety.

TECHNICAL FIELD

This disclosure relates to an electronic device with a mold package and more particularly to semiconductor device having a robust mold package.

BACKGROUND

Mold packages are used to encapsulate electronic devices, including semiconductor chips, to protect from undesirable environmental conditions. Such undesirable conditions include light, heat, humidity, dust, and physical shock. In particular, mold packages are widely used in sensor applications and application specific integrated circuit (ASIC) and integrated circuit (IC) packaging since the mold packages provide a low cost package suited for high volume applications. Most packaging includes the use of a black plastic material, typically including epoxy molding compounds. While many electronic components are completely covered by the mold, except for the contacts extending from the component itself, sensors of many types require a mold package that does not completely cover the device.

Many sensors directly interact with the environment being sensed and therefore require direct access to the sensed environment. Such sensors include gas-sensors, pressure sensors, bio-sensors, finger-print sensors, and humidity sensors. For these types of sensors, an "exposed-die package" is used which provides a mold which does not cover a predetermined area of the sensor which includes the structure of the sensor providing the sensing function. The drawback of such packages, however, is that since the entire device is not covered by the mold, there is a high probability of mold-delamination at an interface of the mold and the sensor device. Where devices are formed of silicon, the mold-silicon interface (or whatever top-most material is used on the sensor) near the exposed sensor-area can delaminate from the silicon.

Consequently, there is a need for a mold package that reduces or substantially prevents the occurrence of delamination between the mold and the sensor.

SUMMARY

The present disclosure relates to the field of encapsulation of electronic devices, and in particular the partial encapsulation of electronic sensing devices in which a portion of the device is unencapsulated to enable direct sensing of a sensed condition. In particular, the present disclosure relates to a device and method of manufacturing a reliable mold package for sensors, especially for exposed die packaged sensors.

In an electronic device with an exposed sensor, the exposed sensor is not encapsulated. In sensing devices made of silicon, a sensing portion is formed in a silicon substrate, as is known by those skilled in the art. The area of the silicon substrate surrounding the sensing portion, however, includes a silicon wafer surface, if silicon is used as a substrate, which provides no sensing function and consequently is covered by the mold. In other embodiments other substrates are used. By introducing a trench-like structure or interlock on the substrate surface adjacent to a sensor surface or area, an interlock structure is provided. The interlock structure increases the adhesion between the mold material and the substrate surface. The increased adhesion reduces the occurrence of a delamination of the mold material from the substrate surface. The potential for delamination is reduced or substantially eliminated.

The trench-like structure is configured to provide a predetermined amount of exposed surface area to provide a contact area between the mold material and the substrate adequate for proper adhesion. By increasing the amount of exposed surface area and configuring the shape of the trench, a desired amount of mechanical coupling between the mold and the substrate is provided. The configuration of the trench and the interface between the mold and the trench also provides an interlocking mechanism. When the substrate has been configured to interlock with the mold, the exposed die mold package is prepared for exposure to harsh environments. In addition, the reliability of the sensor package is improved.

The described embodiments relate to the field of microelectromechanical systems (MEMS) sensors and specifically a robust and reliable packaging of MEMS sensors and a method of fabricating MEMS sensors having an interlocking mold.

A sensor package in one embodiment includes a sensor portion including an upper surface defining a sensor interlock feature, and a mold package including a lower surface defining a mold package interlock feature, wherein the mold package interlock feature is interlocked with the sensor interlock feature.

A method of forming a sensor package in one embodiment includes forming a sensor portion including an upper surface, defining a sensor interlock feature in the upper surface, forming a mold package including a lower surface defining a mold package interlock feature, and interlocking the mold package interlock feature with the sensor interlock feature.

DESCRIPTION

Figure 1:
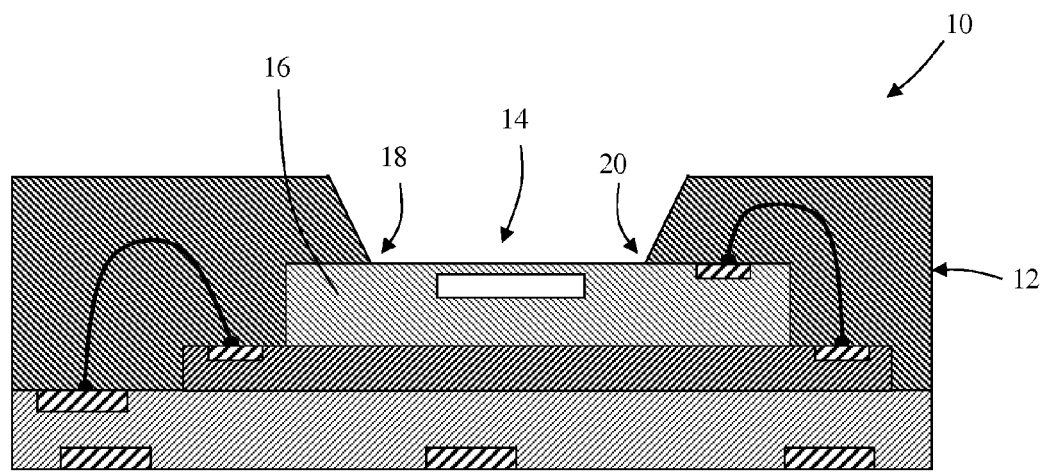
FIG. 1 is a schematic cross-sectional view of a prior art sensor package including a mold and an exposed sensor formed in a silicon substrate.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 illustrates a schematic cross-sectional view of a prior art sensor package 10 including an exposed die mold package 12 and an exposed sensor 14 formed in a silicon substrate 16. The mold package 12 interfaces with a surface of the substrate 16 at a first location 18 and a second location 20. Each of these locations 18 and 20 are susceptible to delamination of the mold package 12 from the substrate 16. While two locations 18 and 20 are illustrated, other areas of delamination between the substrate 16 and the mold package 12 are possible. Mold delamination is possible at any location where the mold package 12 interfaces with the substrate 16.

Figure 2:
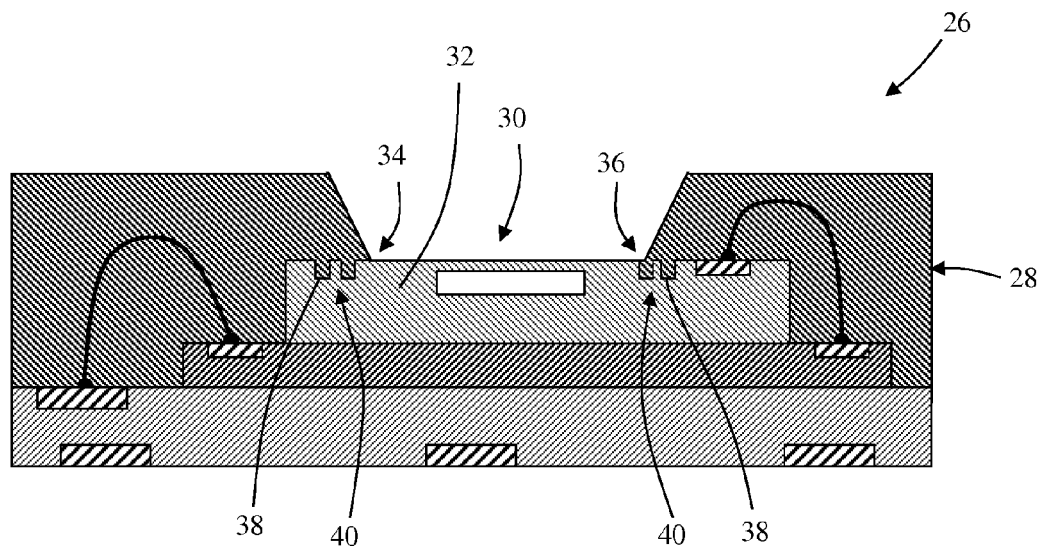
FIG. 2 is schematic cross-sectional view of a sensor package including a mold and an exposed sensor formed in a silicon substrate having an interlock structure.

FIG. 2 illustrates a schematic cross-sectional view of a sensor package 26 including a mold package 28 and an exposed sensor 30. Similar to FIG. 1, the sensor 30 is formed in a substrate 32 upon which the mold package 28 is disposed. In the embodiment of FIG. 2, however, the sensor package includes an interlocking feature 34 and an interlocking feature 36. Each of the interlocking features include an interlocking structure 38 provided by the mold package 28 and an interlocking structure 40 provided by the substrate 32. The interlocking feature 40 provided in the substrate 32 is a recess formed in the surface of a substrate. The interlock structure 38 provided by the mold package is formed by the flow of mold material, which forms the mold package, into the interlock structure 40 or the recess of the substrate 32.

Figure 3:
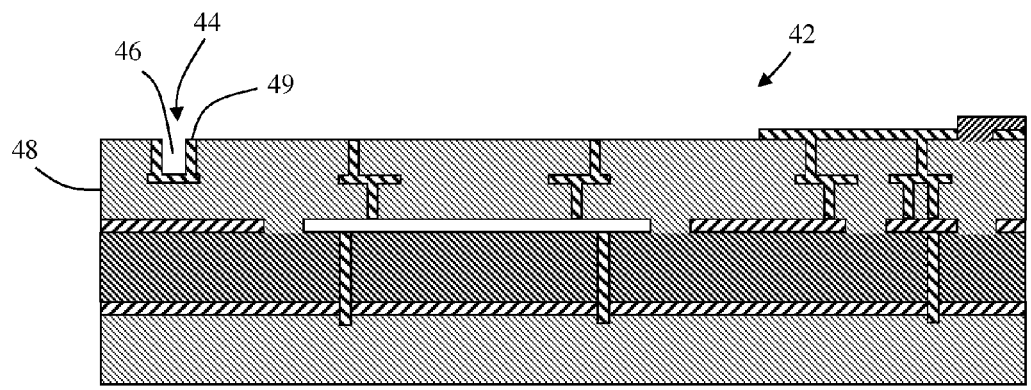
FIG. 3 is a schematic cross-sectional view of a capacitive pressure sensor including an interlock structure.

FIG. 3 illustrates schematic cross-sectional view of a capacitive pressure sensor 42 illustrating an interlock structure 44 formed in the surface of the substrate. As illustrated in FIG. 3, the silicon is etched to form a trench 46 on the surface of a portion of a substrate 48. The trench 46, in different combinations, provides interlocking structures which include apertures, troughs, channels or other formations in the surface of the silicon having sidewalls and a bottom wall of silicon. Once the trench 46 having silicon walls is formed, an oxide layer 49 is deposited on the upper surface of the substrate 48 which also fills the trench. The illustration of FIG. 3 does not show the portion of the oxide layer which is removed from the horizontally depicted upper surface of the substrate 48. The oxide deposition fills in the trench 46 to form an oxide column which is then etched using a photoresist layer (not shown). Etching of the oxide column provides the completed interlock structure 44.

Figure 4A:
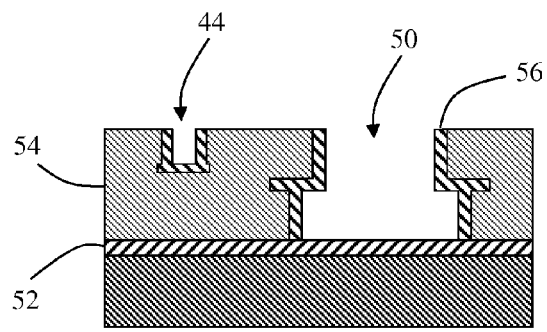
FIGS. 4*a* and 4*b* are schematic cross-sectional views of different configurations of an interlock structure formed in a substrate.
Figure 4B:
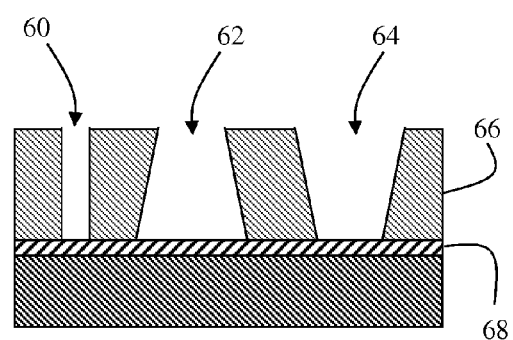

FIGS. 4a and 4b are schematic cross-sectional views of different configurations of interlock structures formed in a portion of a substrate. FIG. 4a illustrates the interlock structure 44 of FIG. 3 and another interlock structure 50. The interlock structure 50 is formed similarly as the structure of FIG. 4a, except that a bottom wall 52 is formed of an oxide layer 52 formed prior to the addition of a silicon layer 54 through which an etched trench is formed. The etched trench includes sidewalls having a deposited oxide layer 56 formed as described above with respect to interlock structure 44. As further illustrated in FIG. 4b, a plurality of interlock structures 60, 62, and 64 are formed in layer of silicon 66 disposed on an oxide layer 68. The interlock structure 60, 62, and 64 each include sidewalls of bare silicon and are not covered with an oxide layer. A floor for each of the interlock structures, however, is provided by the oxide layer 68. In different embodiments, the sidewalls can be include parallel sidewalls (structure 60) inwardly oriented sidewalls (structure 62), and outwardly oriented sidewalls (structure 64).

Figure 5:
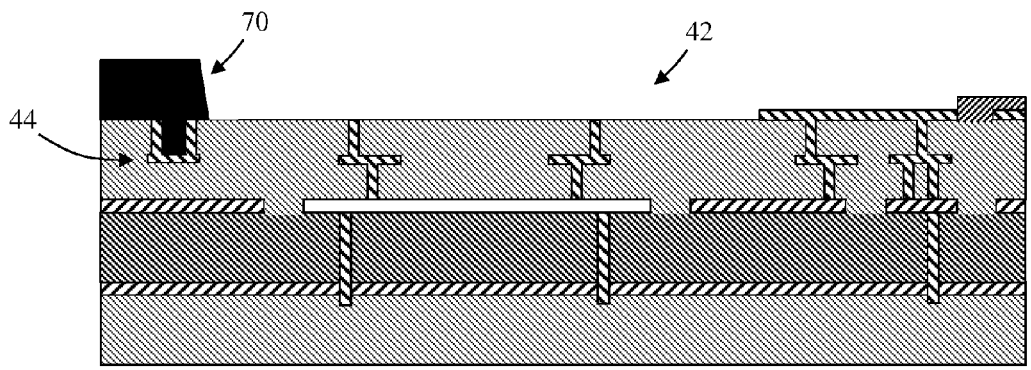
FIG. 5 is a schematic cross-sectional view of the pressure sensor of FIG. 3 including a die mold encapsulation.

FIG. 5 is a schematic cross-sectional view of the pressure sensor 42 of FIG. 3 including a die mold encapsulation 70. As illustrated, the interlock structure 44 is filled with the mold compound and an interlock feature is formed between the mold encapsulation and the trench 46 of pressure sensor 42. The trench 46 having the sidewalls and bottom wall of oxide is completely filled in the illustrated embodiments. In other embodiments, the interlock structure 44 is not completely filled with mold compound, but includes a sufficient amount of compound to hold the encapsulation to the substrate.

Figure 6A:
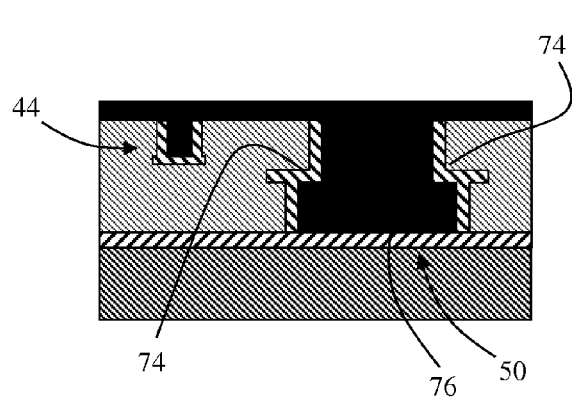
FIGS. 6*a* and 6*b* are schematic cross-sectional views of the configurations of FIGS. 4*a* and 4*b* including a die mold encapsulation.
Figure 6B:
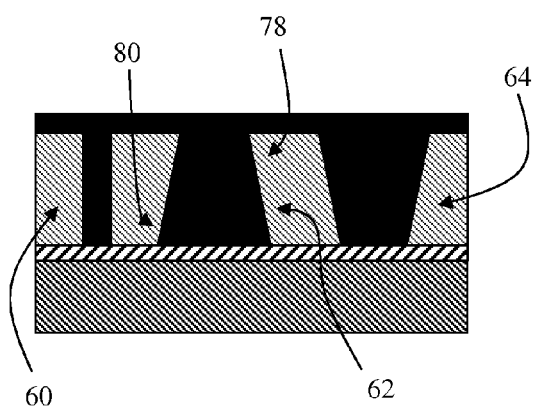

FIGS. 6a and 6b are schematic cross-sectional views of the configurations of FIGS. 4a and 4b including a die mold encapsulation. FIGS. 6a and 6b show the same structures as FIGS. 4a and 4b after the molding process has been completed. The mold compound fills the structures and provides an interlock feature between the mold and the sensor to interlock the mold to the device. The interlock structures do not need to be filled completely as shown. As can be seen in FIG. 6a, a one or more portions 74 of the oxide layer 56 on the vertical walls of the troughs overhangs a lower portion 76 of the mold material. In this way, the portions 74 provide a structure which increases the ability of the interlock structure 50 to hold the mold in place. Likewise in FIG. 6b, the sidewalls of the structure 62 are closer to one another at a top portion 78 than at a bottom portion 80. The structure 62 therefore includes an overhanging structure which increases the ability of the interlock structure 62 to hold the mold in place which reduces or eliminates the occurrence of delamination.

In other embodiments, the trench interlock structures can be realized as a closed ring structure surrounding the sensor area, or as a structure of single trenches and or trench arrays. In other embodiments the interlock structures include one or more circular or oval depressions formed in the substrate which are spaced from one another. In still other embodiments, the interlock structures include apertures configured to receive mold material to provide an interlock feature.

The sensors and devices which include the interlock structure for the mold package of the present disclosure can be embodied in a number of different types and configurations. The following embodiments are provided as examples and are not intended to be limiting.

A sensor in one embodiment includes a trench structure for realizing a mold-interlock. In another embodiment, a mold interlock for exposed-die mold package is provided for sensors, ASICs, and MEMS devices. In yet another embodiment, an interlock structure is provided for use in gas-sensors, pressure sensors, bio-sensors, finger-print sensors, humidity sensors.

A sensor in one embodiment includes a trench structure with increasing diameter and/or critical dimension (trench width if a straight line for example) from a top of a substrate toward an interior or bottom surface of a substrate. In another embodiment, a sensor includes a trench structure with multiple different critical dimensions from a top surface toward a bottom surface of a substrate such as wider and narrower. A sensor in yet another embodiment includes a trench structure being completely filled with mold-compound. In yet another embodiment, a sensor includes a trench structure being at least partly filled with mold-compound. A sensor in yet another embodiment includes a trench structure formed as a closed perimeter surrounding the sensor area.

In one embodiment, a sensor includes a plurality of closed perimeters disposed around the sensor area, wherein adjacent trenches define perimeters of different sizes. A sensor in another embodiment includes a trench structure realized as an array of single/insulated trenches. A sensor in yet another embodiment includes a combination of closed perimeters and insulated trenches. In yet another embodiment, a sensor includes a closed or open perimeter defining a meandering path to increase the amount of interlocking surface area.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A sensor package, comprising:
a sensor portion including an upper surface defining a sensor interlock feature; and
a mold package including a lower surface defining a mold package interlock feature,
wherein the mold package interlock feature is interlocked with the sensor interlock feature.

2. The sensor package of claim 1, wherein:
the sensor interlock feature comprises a first trench extending downwardly from the upper surface; and
the mold package interlock feature comprises a downwardly extending first portion positioned within the first trench.

3. The sensor package of claim 2, wherein:
the first trench includes a first sidewall and a second side wall;
the first sidewall is in opposition to the second sidewall; and
the first sidewall is substantially parallel to the second sidewall.

4. The sensor package of claim 3, wherein an oxide portion is located on each of the first sidewall, the second sidewall, and a bottom of the trench.

5. The sensor package of claim 2, wherein:
the first trench includes a first sidewall and a second side wall;
the first sidewall is in opposition to the second sidewall;
the first sidewall and the second sidewall define a first trench width at a location proximate the upper surface;
the first sidewall and the second sidewall define a second trench width at a location distal to the upper surface; and
the first trench width is less than the second trench width.

6. The sensor package of claim 5, wherein:
the first sidewall includes a first upper portion and a first lower portion;
the second sidewall includes a second upper portion and a second lower portion;
the first upper portion is parallel to the second upper portion;
the first lower portion is parallel to the second lower portion;
the first trench width is defined by the first upper portion and the second upper portion; and
the second trench width is defined by the first lower portion and the second lower portion.

7. The sensor package of claim 5, wherein the downwardly extending first portion substantially fills the first trench.

8. The sensor package of claim 2, wherein:
the sensor interlock feature comprises a second trench extending downwardly from the upper surface; and
the mold package interlock feature comprises a downwardly extending second portion positioned within the first trench.

9. The sensor package of claim 8, wherein:
the sensor portion includes an exposed sensor area;
the first trench extends substantially completely about the exposed sensor area; and
the second trench extends substantially completely about the first trench.

10. The sensor package of claim 9, wherein the first trench defines a serpentine path about the exposed sensor area.

11. A method of forming a sensor package, comprising:
forming a sensor portion including an upper surface;
defining a sensor interlock feature in the upper surface;
forming a mold package including a lower surface defining a mold package interlock feature; and
interlocking the mold package interlock feature with the sensor interlock feature.

12. The method of claim 11, wherein:
defining the sensor interlock feature comprises forming a first trench extending downwardly from the upper surface;
forming the mold package comprises forming a downwardly extending first portion of the mold package within the first trench; and
forming the mold package further comprises defining an exposed area of the upper surface through the mold package and inwardly of the first trench.

13. The method of claim 12, wherein:
forming the first trench includes defining a first trench with substantially parallel sidewalls.

14. The method of claim 13, further comprising:
forming an oxide portion on each of the first sidewall and the second sidewall.

15. The method of claim 12, wherein:
forming the first trench includes forming a trench having a first trench width at a location proximate the upper surface and a second trench width at a location distal to the upper surface; and
the first trench width is less than the second trench width.

16. The method of claim 15, wherein forming the first trench comprises:
forming a lower portion of the trench with substantially parallel sidewall portions; and
forming an upper portion of the trench with substantially parallel sidewall portions,
wherein the upper portion defines a trench width which is less than a trench width defined by the lower portion.

17. The method of claim 12, wherein:
defining the sensor interlock feature comprises forming a second trench extending downwardly from the upper surface; and
forming the mold package comprises forming a downwardly extending second portion of the mold package within the first trench.

18. The method of claim 17, wherein forming the second trench comprises:
forming the second trench substantially completely about the first trench.

19. The method of claim 18, wherein forming the second trench comprises:
forming a serpentine trench substantially completely about the first trench.

20. A sensor package, comprising:
a sensor portion including an upper surface defining a sensor interlock feature; and
a mold package including a lower surface defining a mold package interlock feature,
wherein the mold package interlock feature is interlocked with the sensor interlock feature, and
wherein the mold package defines an exposed area of the upper surface through the mold package and inwardly of the sensor interlock feature.

* * * * *